United States Patent [19]

Milliren

[11] Patent Number: 4,471,716
[45] Date of Patent: Sep. 18, 1984

[54] WAFER CARRIER

[75] Inventor: Guy L. Milliren, Mound, Minn.

[73] Assignee: Fluoroware, Inc., Chaska, Minn.

[21] Appl. No.: 409,841

[22] Filed: Aug. 20, 1982

Related U.S. Application Data

[63] Continuation of Ser. No. 225,353, Jan. 15, 1981, abandoned.

[51] Int. Cl.³ .............................................. B05C 13/02
[52] U.S. Cl. ..................................... 118/500; 118/320; 211/40; 211/41; 206/454; 206/328; 134/137
[58] Field of Search ............... 118/500, 728, 428, 320, 118/52; 211/40, 41; 269/962, 903, 46; 206/454, 587, 332, 334, 328, 564; 134/137, 144, 148, 149, 157, 158, 198, 199, 201

[56] References Cited

U.S. PATENT DOCUMENTS 3,923,156 12/1975 Wallestad .................... 118/500 X
3,961,877 6/1976 Johnson ............................ 432/253

Primary Examiner—John D. Smith
Assistant Examiner—Bernard F. Plantz
Attorney, Agent, or Firm—Peterson, Palmatier, Sturm, Sjoquist & Baker, Ltd.

[57] ABSTRACT

A PFA Teflon carrier for silicon wafers being processed in hot baths in the production of integrated circuit chips with sidewalls having wafer spacing webs and grooves receiving the wafers in confronting and spaced relation. The sidewalls having outboard channel supports or stiffening bars extending substantially to the ends of the sidewalls and adjacent offsets in the sidewalls which connect to the end walls of the receptacle, one end wall being H-shaped and having a cross bar panel with elongate parallel stiffener bars thereon at the level of the bottom edge of the wafer confining panels in the sidewalls, the stiffener bars in the end walls having their ends spaced from the sidewalls.

7 Claims, 5 Drawing Figures

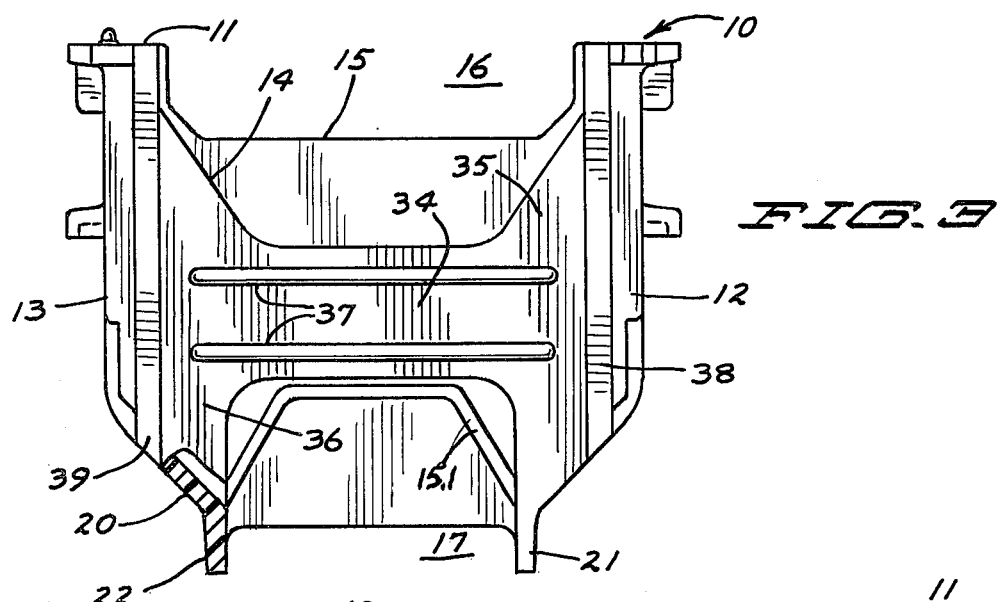
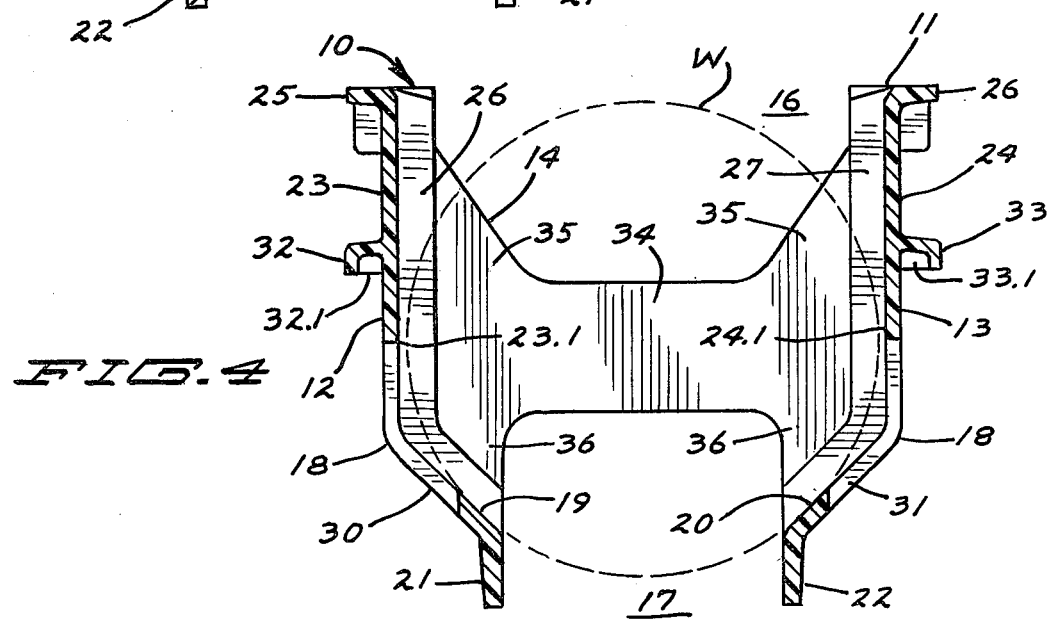
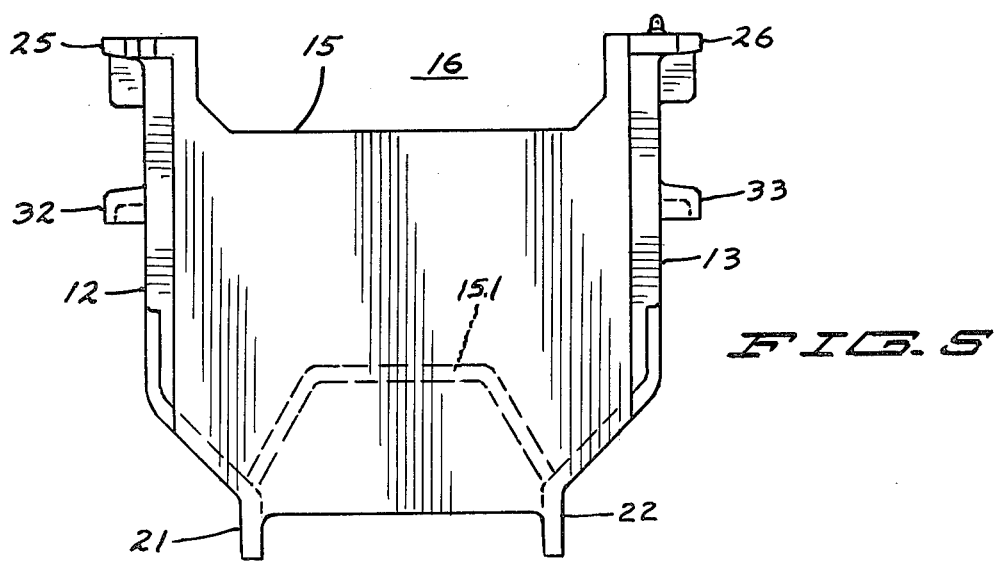

WAFER CARRIER

This application is a continuation of application Ser. No. 225,353, filed Jan. 15, 1981, now abandoned.

This invention relates to molded plastic for silicon wafers during the processing thereof in the production of integrated circuit chips.

BACKGROUND OF THE INVENTION

In the processing of such silicon wafers, the carriers are exposed to the same identical baths into which the wafers must be immersed. These baths include various corrosive chemicals and certain of the baths are extremely hot, in the range of 180° C. Accordingly, the carriers used to hold the silicon wafers during processing are formed of plastic which is essentially inert and highly resistant to the corrosive effect of the chemicals used, and highly resistive to the high bath temperatures regularly employed during the processing. Conventionally, the molded plastic used in carriers is PFA Teflon, a perfluoroalkoxy-substituted polytetrafluoroethylene resin.

It should be recognized that the silicon wafers are extremely delicate and brittle and may be only a few thousandths of an inch thick. The diameter of such wafers may be in the range of four inches or more. The silicon wafers are extremely valuable, and breakage of a wafer may represent a significant loss.

One of the numerous problems that has been encountered in handling these large but thin silicon wafers is that the wafer baskets which have been known soften when exposed to the 180°–200° C. temperatures, and warping of the carriers also occurs. The warping and bowing or the carriers tends to put added compressive pressure on the edges of the delicate wafers. Breakage has been prevalent due to the forces applied by the carrier and by the warping of the carrier out of its desired and normal rectangular shape. The application of pressure onto the edges of the wafers by the carrier tends to amount to clamping of the wafers in the carrier, making removal of the wafers from the carrier both difficult and hazardous from the standpoint of possible breakage.

Other problems that have existed with previous carriers have related to the inadequate capability of the carrier to allow liquid to pass through the carrier and over the surfaces of the wafers carried thereby. In addition, breakage problems have been encountered during the removal of the wafers from the carrier, while the wafers roll toward the open top after the carrier has been tipped to an inclined position.

SUMMARY OF THE INVENTION

An object of the invention is to provide a new and improved carrier of simple and inexpensive construction in operation for silicon wafers during the processing thereof in the production of integrated circuit chips.

Another object of the invention is the provision of a novel molded plastic wafer carrier of improved and significantly different construction to minimize warping and distortion thereof while the wafers carried thereby are being immersed in extremely hot baths which may tend to soften the plastic of the carrier.

Still another object of the invention is to provide an improved carrier for silicon wafers which provides in the sidewalls, improved and substantial slots or passageways for flow of fluids there through in the processing of the wafers, while still providing substantial uninterrupted panels to engage the wafer edges and permit the wavers to roll smoothly into and out of the receptacles during loading or unloading thereof.

Important features of this invention include the construction of the uninterrupted panels in the upper portions of the sidewalls, to confront and engage the edges of the wafers at locations intermediate the height of the sidewalls and carrier and to also carry, at the exterior side, elongate horizontally extending bars located intermediate the height of the sidewalls in a manner previously thought to be impossible. Both of these aspects contribute materially to the minimizing of possible breakage of the wafers by avoiding any possible rough handling of wafers and avoiding the application of compressive pressures onto the side edges of the wafers. Additional features of the invention include the provision of externally protruding ribs on the exterior of the crossbar in the H shaped end wall of the carrier; these ribs on the end wall having their ends in spaced relation with upright indexing bars on the exterior face of the end wall and adjacent the sidewall. The ribs on the crossbar of the H shaped end wall, in the particular construction with their ends spaced from the indexing bar contribute materially to preventing warping of the carrier during exposure to the extremely hot baths for processing.

Added features of the invention are the downward extension of the sidewalls below the lower most extent of the end walls and beyond the lowermost extend of the protruding indexing cards at the end wall. This relationship of the offset sidewalls adjacent the end walls contributes materially to preventing warping and distortion of the carrier during high temperature processing of the wafers.

The longitudinal ribs protruding outwardly from the wafer confining panels intermediate the height of the sidewalls of the carrier unexpectedly minimize any inward bowing, so as to minimize the likelihood of application of compressive pressure by the carrier against the edges of the wafers. Breakage of the wafers is thereby minimized, and removal of the wafers from the carriers is not inhibited. The wash slots which open vertically as well as transversely through the offset portions of the sidewalls permit effective passage of the processing liquids over the confined wafers. This is especially useful in centrifugal processing of the wafers in the carrier about rotation axes parallel to the axis extending endwise through the spaced and aligned wafers in the carrier. Because the wafer confining panels at the upper portions of the sidewalls extend downwardly below the midpoint of the wafers, the wafers, when rolling out of or into the carrier need not pass over any edges of panels or over any notches or any other rough obstructions.

BRIEF DESCRIPTION OF DRAWINGS

FIG. 3 is an end elevation view of the carrier.

FIG. 4 is a detail section view taken approximately 4—4 of FIG. 2, and

FIG. 5 is an elevation view of the end opposite that seen in FIG. 3.

DETAILED SPECIFICATION

Figure 2:
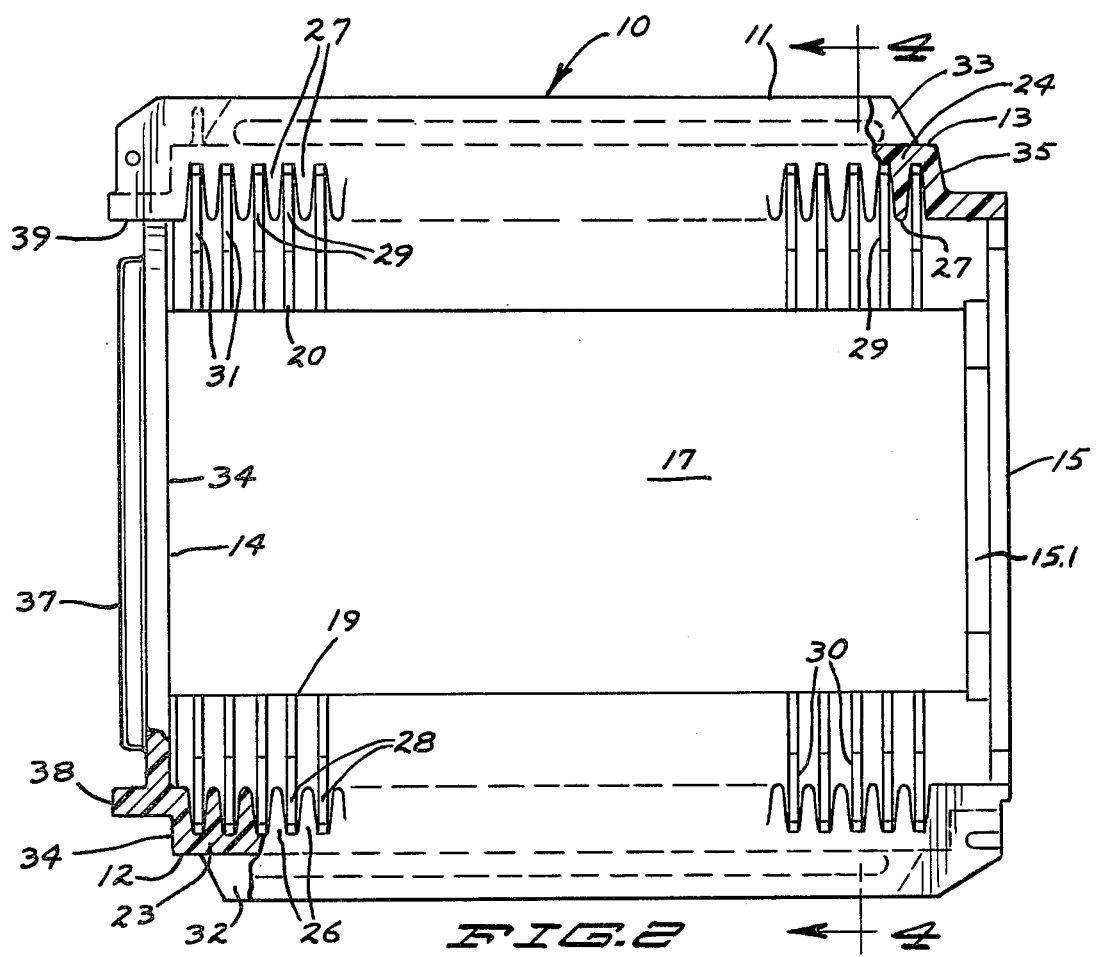
FIG. 2 is a top plan view with portions thereof broken away and shown in section for clarity of detail.
Figure 1:
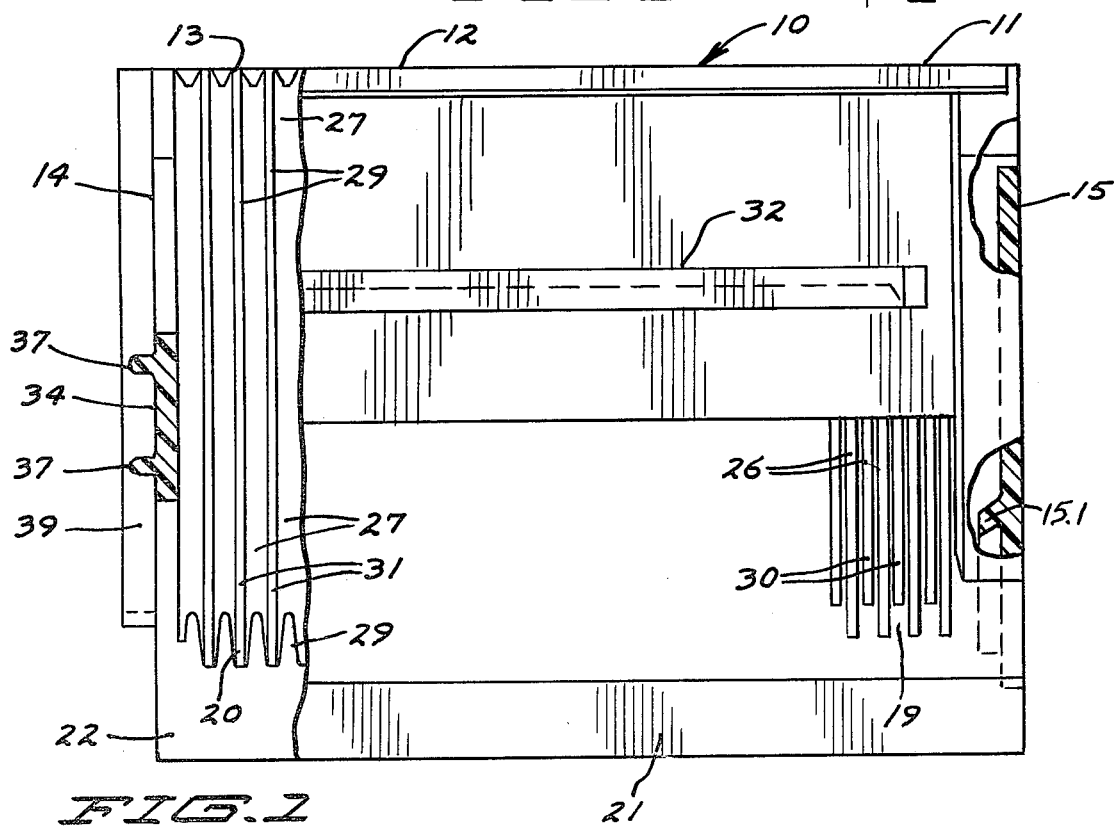
FIG. 1 is a side elevation view of the carrier with a portion broken away and shown in section for clarity of detail.

One form of the invention is shown in the drawings described herein. The carrier is indicated in general by numeral 10 and comprises a receptacle 11 molded integrally and in one piece of PFA Teflon, a perfluroalkoxy-substituted polytetrafluoroethylene resin, or other suitable plastic which is resistant to high temperatures in the range of 180° to 200° C. and highly resistant to high active chemicals used during the processing of silicon wafers W used in the manufacture of integrated circuit chips.

The receptacle 11 includes two sidewalls 12 and 13, and a pair of end walls 14 and 15. The receptacle 11 has an open top 16 through which the wafers W are loaded into and removed from the receptacle; and an open bottom 17, allowing easy access for liquids used in processing the wafers W carrried by the carrier.

The sidewalls 12 and 13 are speced from each other a distance slightly in excess of the diameter of the wafers W, and have an overall height, also somewhat in excess of the diameter of the wafers so that the receptacle totally receives or confines the wafers W therein. Each of the sidewalls 12 and 13 is offset inwardly at 18 so that the open bottom 17 is slightly narrower than the open top 16. The sidewalls 12 and 13 include obliquely oriented wafer supporting panels 19 and 20 respectively which are oriented tangent to a circle equal to the diameter of the wafers W so as to engage and cradle the edges of the wafers to be supported in the carrier.

The sidewalls 12 and 13 also have vertically oriented spacer panels 21 and 22 depending from the lower edge portions of the wafer supporting panels 19 and 20. These panels 21 and 22 serve as feet for the receptacle to rest upon the top surface of a support while maintaining the lower edge portions of the wafers W suitably spaced upwardly to be protected.

The upper portions of sidewalls 12 and 13 have wafer confining panels 23 and 24 which are continuous from end to end of the receptacle and which extend downwardly from the upper lips 25 an 25.1 downwardly to a location intermediate the height of the sidewalls. The lower portions of the panels 23 and 24 also lie tangent to the same circle to which panels 19 and 20 are tangent so that these lower portions 23.1 and 24.1 lie tangent to the circular wafers W and confine the wafers against significant side to side motion as seen in FIG. 4.

The sidewalls also have elongate upright wafer spacing webs over leaves 26 and 27 which extend vertically downwardly along the wafer confining panels 23 and 24, are offset at 18 and extend obliquely downwardly along the wafer supporting panels 19 and 20.

The wafer spacing webs 26 are in confronting and spaced relation to each other and define wafer receiving grooves 28 and 29 therebetween.

It will be recognized that sidewalls 12 and 13 also have a multiplicity of liquid flow through wash slots 30 and 31 between the wafer spacing webs 26 and 27 at the lower portion of the sidewalls. The wash slots 30, 31 extend vertically from the lower edge portions 23.1 and 24.1 of the wafer confining panels 23 and 24 downwardly past the offset 18 and to the upper edges of the wafer suppport panels 19 and 20. It will be recognized that the lower portions of wash slots 30 and 31 traverse and open vertically through the offset portion of the sidewalls to allow vertical passage of liquid through these wash slots, along with the vertical passage of liquid through the open bottom 17 of the receptacle. Accordingly, improved rinsing and other flow of liquids through the receptacle and over the wafers is accommodated.

The sidewalls 12 and 13 have elongate channel supports or stiffening bars 32 and 33 molded integrally thereof and extending all along the wafer confining panels 23 and 24 substantially to the ends of the receptacle. The stiffening bars 32 and 33 are channel shaped, opening downwardly, and are located immediately adjacent the lower portions 23.1 and 24.1 of the panels 23 and 24 and in widely spaced relation downwardly from the upper lips 25 and 26 of the sidewalls.

It will be recognized that the wafer confining panels 23 and 24 have offsets 34 and 35 respectively at their ends adjacent the endmost wafer receiving grooves 28 and 29, but spaced from the end walls 14 and 15. The ends of the wall stiffening ribs 32 and 33 are short of the offset 34.

In FIG. 4, it will be recognized that the wall stiffening bars 32 have depending lips at their outer edges which define downwardly facing channel openings 32.1 and 33.1.

End wall 14 is substantialy H-shaped, and extends between the sidewalls 12 and 13. The end wall 14 has a cross bar panel 34, and gusset portions 35 which are generally triangularly shaped to stiffen the end wall and minimize movement of the sidewalls 12 and 13 relative to the end wall. The end wall 14 also has lower gusset portions 36 also attached to the sidewalls.

End wall 14 is provided with a pair of elongate stiffening or anti-warping bars or ribs 37 which are spaced from each other and which extend across the entire width of the end wall 14 into spaced relation with the sidewalls 12 and 13. In view of the fact that there are two such ribs 37 extending across substantially the entire width of the end wall 14, but terminating in spaced relation with the sidewalls, the end wall 14 is significantly stiffened and is prevented from warping. Furthermore, because the ribs 37 have their ends in spaced relation with the sidewalls 12 and 13, any deformation of the sidewalls will not necessarily deform the ends walls which are held rigid by the ribs 37.

The sidewalls 12 and 13 have vertical indexing bars 38 and 39 which are also spaced transversely outwardly from the ends of the stiffening ribs 37.

It will be recognized in FIG. 3, that the end wall 14 terminates at the wafer supporting panels 19 and 20 and that the upright panels 21 and 22 protrude downwardly beyond the bottom of the end wall 14. Similarly, the endwardly protruding indexing bars 38 which extend downwardly from the top of the sidewalls extend downwardly only to the wafer supporting panels 19 and 20.

In using the carrier 10, there will usually be twenty-five wafers W carrier in closely spaced relation with each other in the grooves 28 and 29, and the wafers will be supported on the panels 19 and 20 of the sidewalls and confined by the upright panels 23 and 24. As the carrier and the wafers are immersed in hot baths with temperatures in the range of 180° to 200° C., the plastic of the carrier does become softened. However, the channel supports or stiffening bars 32 and 33 disposed intermediate the height of the sidewalls will prevent bowing of the sidewalls in an inward direction against the wafers. Because the stiffening bars 32 and 33 terminate short of the ends of the panels 23 and 24 and in spaced relation with the offsets 34 and 35 therein, and deformation of other parts of the receptacle or carrier will have a minimum influence on the sidewalls and the sidewalls will not necessarily become distorted or bowed as a result of any distortion of any other portions of the receptacle.

In a somewhat similar way, the ribs 37, cooperate with each other in preventing any warping of the end wall 14. Because these ribs 37 have their ends in spaced relation with the sidewalls, the end wall 14 will be held against warping regardless of any distortion or motion that may occur in the sidewalls 12 and 13. As a result, the stiffening bars 37 contribute materially to minimizing warping of the receptacle 11 as a whole.

The wash slots 30 and 31 allow flow of liquid there through in vertical direction parallel to the panels 23 and 24 and in directions transversely of the receptacle in horizontal directions normal to the panel 23 and 24. In this regard, it will be recognized that the upper edges of panels 19 and 20 are spaced apart by a distance which is significantly less than the spacing between panels 23 and 24.

Warping and deformation of the receptacle is also materially reduced by shortening the end walls 14 and 15 adjacent their lower edges so that the entire upright panels 21 and 22 extend downwardly from the lower portions of the end walls 14 and 15.

End wall 15 extends substantially from top to bottom of the carrier receptacle 11, with the exception that the top edge of the end wall 15 is recessed downwardly slightly below the level of the lips 25 and 26 of the sidewalls. The end wall 15 has a generally arched-shaped rib 15.1 extending between the sidewalls adjacent the lower portion of the end wall. The arch-shaped rib 15.1 protrudes inwardly of the receptacle from the end wall 15 and minimizes deformation of the end wall when the carrier is exposed to extremely hot ambient conditions as in the baths used for processing the silicon wafers.

It will be recognized that the present invention provides cooperating ribs and bars on the sidewalls and H-shaped end walls of the receptacle which although isolated from each other cooperate in maintaining the walls and end walls without distortion and minimizing influence on one wall upon another so as to avoid warping of the receptacle as a whole.

What is claimed is:

1. A carrier for silicon wafers being processed in a centrifugal spray device in the production of integrated circuit chips, comprising
    a rectangular receptacle of molded plastic resistant to high temperatures and corrosive chemicals of the processing liquids for the wafers, the receptacle having end walls and sidewalls and also having an open top extending transversely across the receptacle to the sidewalls thereof to accommodate insertion and removal of wafers, the receptacle also having an open bottom,
    the sidewalls having upper portions with wafer confining panels for confronting and confining the edges of the wafers in the receptacle, the sidewalls also having offset lower portions converging obliquely toward the open bottom and the offset lower portions of the sidewalls also defining wafer supporting panels defining the open bottom of the receptacle and also having outer edges,
    and the sidewalls also having integrally formed wafer spacing webs on the inner sides thereof and defining a multiplicity of wafer receiving grooves therebetween, the wafer spacing webs having upper portions extending vertically downwardly from the wafer confining panel and having lower portions extending obliquely downwardly in the offset lower portions of the sidewall and to the wafer supporting panels, the upper and lower portions of the sidewalls having elongate wash slots between the adjacent wafer spacing webs to pass sprayed liquid therethrough, said wash slots extending along the lower portions of the wafer spacing webs and traversing the offset lower portion of the sidewalls to the outer edges of the water supporting panels whereby the wash slots in the lower offset portions of the sidewalls cooperate with the open bottom to freely pass spray and flow of liquids moving across the wafers adjacent the wafer confining panels and to and from the open top.

2. A carrier according to claim 1 and the wafer confining panels having side faces with lower portions to confront and engage the edges of the wafers to minimize movement thereof, said lower portions of the side faces of the confining panels being spaced downwardly from the open top by a distance approximately half the width of the carrier between the two wafer confining panels.

3. A carrier according to claim 1 and the wafer confining panels having lower portions located approximately midway between the top of the carrier and the wafer supporting panels to confront and engage the edges of the wafers and minimize movement thereof.

4. A carrier according to claim 1 wherein the wafer supporting panels have oblique wafer supporting faces in downwardly converging relation to each other, outer edges of the oblique wafer supporting panels being located approximately midway said obliquely oriented offset lower portions of the sidewalls.

5. A carrier for circular silicon wafers being processed in a centrifugal spray device in production of integrated circuit chips, comprising
    a rectangular receptacle of molded plastic resistant to high temperature and corrosive chemicals of the processing liquids for the wafers, the receptacle having an open top for insertion and removal of the wafers and an open bottom, the receptacle having end walls and sidewalls, the open top extending transversely across the receptacle to the sidewalls thereof,
    the sidewalls having upright upper portions and also having oblique lower portions with wafer supporting panels spaced from each other to define said open bottom, the supporting panels having upper faces upon which the wafers are supported, the upper portions of the sidewall having wafer confining panels with upright front faces and lower edges, the front faces confronting and engaging the edges of the wafers in the receptacle,
    and the sidewalls also having a multiplicity of wafer spacing webs on the inner side thereof and defining a multiplicity of wafer receiving grooves therebetween, the wafer spacing webs having upper and lower portions in the respective upper and lower portions of the sidewalls, the upper portions of the webs extending downwardly from the wafer confining panels and the lower portions of the webs extending obliquely downwardly to the wafer supporting panels, the sidewalls having elongate wash slots between the adjacent wafer spacing webs to accommodate free passage of liquid spray therethrough, said wash slots extending from the lower ledge of the wafer confining panels and along the wafer spacing webs and to the wafer supporting panel, the wash slots traversing the lower portions of the sidewalls adjacent the wafer supporting panels to pass sprayed liquid parallel to and across the wafer confining panels and across peripheral areas of the wafers and also in other directions across the wafers.

6. A carrier according to claim 5 and the lower portion of each of the sidewalls including an upright elevating panel depending from the lower edge of the oblique wafer supporting panel, said elevating panels being widely spaced from each other in confronting relation and defining the open bottom of the receptacle.

7. A carrier according to claim 5 wherein the wafer confining panels have lower edges located approximately at the opposite ends of horizontal diameters of the circular wafers on the supporting panels.

* * * * *

UNITED STATES PATENT AND TRADEMARK OFFICE
CERTIFICATE OF CORRECTION

PATENT NO. : 4,471,716
DATED : September 18, 1984
INVENTOR(S) : Guy L. Milliren

It is certified that error appears in the above-identified patent and that said Letters Patent are hereby corrected as shown below:

Column 1, line 6, after "plastic", insert --carriers--.

Column 2, line 3, delete "wavers" and substitute --wafers--.

Column 2, line 31, delete "extend" and substitute --extent--.

Column 4, line 18, delete "offset" and substitute --offsets--.

Column 4, line 67, delete "and" (2nd occurr.) and substitute --any--.

Column 5, line 43, delete "on" and substitute --of--.

Column 6, line 11, delete "water" and substitute --wafer--.

Column 7, line 1, delete "ledge" and substitute --edge--.

Signed and Sealed this

Sixteenth Day of April 1985

[SEAL]

Attest:

DONALD J. QUIGG

Attesting Officer   Acting Commissioner of Patents and Trademarks